(12) United States Patent
He et al.

(10) Patent No.: US 8,138,954 B2
(45) Date of Patent: *Mar. 20, 2012

(54) METHOD AND SYSTEM FOR EFFICIENT DATA TRANSMISSION WITH SERVER SIDE DE-DUPLICATION

(75) Inventors: Dake He, Waterloo (CA); Vadim Sheinin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

This patent is subject to a terminal disclaimer.

(21) Appl. No.: 12/751,888

(22) Filed: Mar. 31, 2010

(65) Prior Publication Data

US 2010/0188273 A1 Jul. 29, 2010

Related U.S. Application Data

(63) Continuation of application No. 12/273,329, filed on Nov. 18, 2008, now Pat. No. 7,733,247.

(51) Int. Cl.
*H03M 7/00* (2006.01)
(52) U.S. Cl. .............. 341/50; 341/81; 341/87
(58) Field of Classification Search .......... 341/50–51, 341/87
See application file for complete search history.

(56) References Cited

U.S. PATENT DOCUMENTS

| | | | | |
|---|---|---|---|---|
| 7,271,747 B2* | 9/2007 | Baraniuk et al. | | 341/87 |
| 7,295,137 B2* | 11/2007 | Liu et al. | | 341/51 |
| 7,653,867 B2* | 1/2010 | Stankovic et al. | | 714/785 |
| 2006/0200733 A1* | 9/2006 | Stankovic et al. | | 714/801 |
| 2007/0233707 A1 | 10/2007 | Osmond et al. | | |
| 2007/0255758 A1 | 11/2007 | Zheng et al. | | |
| 2008/0005201 A1 | 1/2008 | Ting et al. | | |
| 2008/0065633 A1 | 3/2008 | Luo et al. | | |
| 2009/0103606 A1* | 4/2009 | Lu et al. | | 375/240.02 |

OTHER PUBLICATIONS

David Slepian and Jack K. Wolf, Noiseless Coding of Correlated Information Sources, IEEE Transactions on Information Theory; Jul. 1973; pp. 471-480; vol. 19, United States.

Cui, et al., Opportunistic Source Coding for Data Gathering in Wireless Sensor Networks, IEEE Int'l Conf. Mobile Ad Hoc & Sensor Systems, Oct. 2007, http://caltechcstr.library.caltech.edu/569/01 HoCuiCodingWirelessSensorNetworks.pdf, United States.

Balachandran, et. al, Sequence of Hashes Compression in Data De-duplication, Data Compression Conference, Mar. 2008, p. 505, issue 25-27, United States.

Tsai et al., The Efficiency and Delay of Distributed Source Coding in Random Access Sensor Networks, 8th IEEE Wireless Communications and Networking Conference, Mar. 2007, pp. 786-791, United States.

Wang, et al., Distributed Data Aggregation Using Clustered Slepian-Wolf Coding in Wireless Sensor Networks, IEEE International Conference on Communications, Jun. 2007, pp. 3616-3622, United States.

* cited by examiner

*Primary Examiner* — Khai M Nguyen
(74) *Attorney, Agent, or Firm* — Kenneth L. Sherman, Esq.; Michael Zarrabian, Esq.; Myers Andras Sherman & Zarrabian LLP

(57) ABSTRACT

The invention provides a method and system for reducing redundant data blocks. The method includes reducing redundant data blocks by decoding a first data block from a first plurality of data blocks and a bitstream.

25 Claims, 3 Drawing Sheets

METHOD AND SYSTEM FOR EFFICIENT DATA TRANSMISSION WITH SERVER SIDE DE-DUPLICATION

CROSS-REFERENCE TO RELATED APPLICATIONS

This application is a continuation of U.S. patent application Ser. No 12/273,329, now U.S. Pat. No. 7,733,247 filed on Nov. 18, 2008, incorporated herein by reference.

BACKGROUND OF THE INVENTION

1. Field of the Invention

The present invention relates generally to removing redundant data, and in particular to reducing data transmission for server side data de-duplication.

2. Background Information

De-duplication processes partition data objects into smaller parts (named "chunks") and retain only the unique chunks in a dictionary (repository) of chunks. To be able to reconstruct the object, a list of hashes (indexes or metadata) of the unique chunks is stored in place of original objects. The list of hashes is customarily ignored in the de-duplication compression ratios reported by various de-duplication product vendors. That is, vendors typically only report the unique chunk data size versus original size.

The list of hashes is relatively larger when smaller chunks are employed. Smaller chunks are more likely to match and can be used to achieve higher compression ratios. Known de-duplication systems try to diminish the significance of index metadata by using large chunk sizes, and therefore, accept lower overall compression ratios. Also, standard compression methods (LZ, Gzip, Compress, Bzip2, etc.) applied to the list of hashes perform poorly.

In order to reduce bandwidth requirements from client to server, (hash-based) data de-duplication has to be performed at the client. Client side data de-duplication has the following:
1) It is difficult to deploy as client side data de-duplication requires tighter integration into existing applications and systems; 2) It is difficult to do direct compare when using hashing methods in client side data de-duplication, and delta differencing requires large local cache which might not be available in a resource-limited client.

When client side data de-duplication is not possible, the alternative is to perform data de-duplication at the server. In server side data de-duplication, data is transmitted before de-duplication in the link from the client to server.

SUMMARY OF THE INVENTION

The invention provides a method and system for reducing redundant data blocks. The method includes encoding a first data block having a first length into a bitstream having a second length, transmitting the bitstream to a server device, and reducing redundant data blocks by decoding the first data block from a first plurality of data blocks and the bitstream where each block in the first plurality of data blocks has a length equal to the first length.

In one embodiment of the invention, the decoding is performed with a Slepian-Wolf decoder. In another embodiment of the invention, upon decoding being successful for the complete first length, de-duplication is performed on the first data block. In yet another embodiment of the invention, upon the decoding being unsuccessful for the complete first length, requesting further information of the first data block from a client. This embodiment of the invention further provides encoding the first data block having the first length into another bitstream having one of the second length and a third length, transmitting the other bitstream to the server device, and reducing redundant data blocks by decoding the first data block from a second plurality of data blocks and the other bitstream, where each block in the second plurality of data blocks has a length equal to the first length. In still another embodiment of the invention, de-duplication is performed by the decoding. In one embodiment of the invention, the decoding is performed with a variable length for a predetermined collision rate. In another embodiment of the invention, a transmission rate for the transmitting is variable to meet a predetermined collision rate.

In another provision of the invention, a system for reducing redundant data blocks includes a client device including an encoder module configured to encode a data block into a bitstream, a server device including a decoder module configured to decode the bitstream using a plurality of previously stored data blocks on the server device, and a de-duplication module coupled to the decoder module configured to deduplicate successful decoded portions of the data block.

One embodiment of the invention further includes a data storage device coupled to the server device. Another embodiment of the invention further includes at least another client device. In yet another embodiment of the invention, the encoder module performs a Slepian-Wolf encoding. In still another embodiment of the invention, the decoder module performs a Slepian-Wolf decoding. In one embodiment of the invention, the de-duplication module further includes a sequence identifier module configured to identify sequences of chunk portion identifiers of a data object, an indexing module configured to apply indexing to identification of chunk portions based on a sequence type, and an encoding module configured to encode first repeated sequences with a first encoding and encodes second repeated sequences with a second encoding, wherein storing repeated sequences of chunk portion identifiers is avoided.

Yet another embodiment of the invention provides a computer program product for reducing transmission of redundant data before de-duplication. The computer program product when executed by a processor encodes a first data block having a first length into a bitstream having a second length, transmits the bitstream to a server device, and reduces redundant data blocks by decoding the first data block from a first plurality of data blocks and the bitstream where each block in the first plurality of data blocks has a length equal to the first length.

In one embodiment of the invention, the decoding is performed with a Slepian-Wolf decoder. In another embodiment of the invention, upon decoding being successful for the complete first length, de-duplication is performed on the first data block. In yet another embodiment of the invention, upon decoding being unsuccessful for the complete first length, requesting further information of the first data block from a client. Still another embodiment of the invention further causes the computer to encode the first data block having the first length into another bitstream having one of the second length and a third length, transmit the other bitstream to the server device, and reduce redundant data blocks by decoding the first data block from a second plurality of data blocks and the other bitstream, where each block in the second plurality of data blocks have a length equal to the first length. In one embodiment of the invention, a transmission rate for the transmitting is variable to meet a predetermined collision rate.

Still another embodiment of the invention provides method including encoding a first data block having a first length into a bitstream having a second length using a Slepian-Wolf encoding process, transmitting the bitstream to a server device, and reducing redundant data blocks before de-duplication using a Slepian-Wolf decoding process by decoding the first data block from a first plurality of data blocks and the bitstream, where each block in the first plurality of data blocks have a length equal to the first length.

In one embodiment of the invention, upon the decoding being unsuccessful for the complete first length, requesting further information of the first data block from a client. In another embodiment of the invention, the method further includes encoding the first data block having the first length into another bitstream having one of the second length and a third length, transmitting the other bitstream to the server device, and reducing redundant data blocks by decoding the first data block from a second plurality of data blocks and the other bitstream, where each block in the second plurality of data blocks has a length equal to the first length.

Yet another embodiment of the invention provides a system for reducing transmission of redundant data blocks. The system includes a client device including a Slepian-Wolf encoder module configured to encode a data block into a bitstream, a server device including a Slepian-Wolf decoder module configured to decode the bitstream using a plurality of previously stored data blocks on the server device, and a de-duplication module coupled to the decoder module configured to deduplicate successful decoded portions of the data block.

In one embodiment of the invention, the Slepian-Wolf decoder is configured to reduce redundant data blocks before de-duplication.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as a preferred mode of use, reference should be made to the following detailed description read in conjunction with the accompanying drawings, in which.

DESCRIPTION OF THE PREFERRED EMBODIMENTS

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The description may disclose several preferred embodiments of reducing redundant data blocks before de-duplication, as well as operation and/or component parts thereof. While the following description will be described in terms of de-duplication reduction processes and devices for clarity and to place the invention in context, it should be kept in mind that the teachings herein may have broad application to all types of systems, devices and applications.

The invention provides a method and system for reducing redundant data blocks. The method includes encoding a first data block having a first length into a bitstream having a second length, transmitting the bitstream to a server device, and reducing redundant data blocks by decoding the first data block from a first plurality of data blocks and the bitstream where each block in the first plurality of data blocks has a length equal to the first length.

Figure 1:
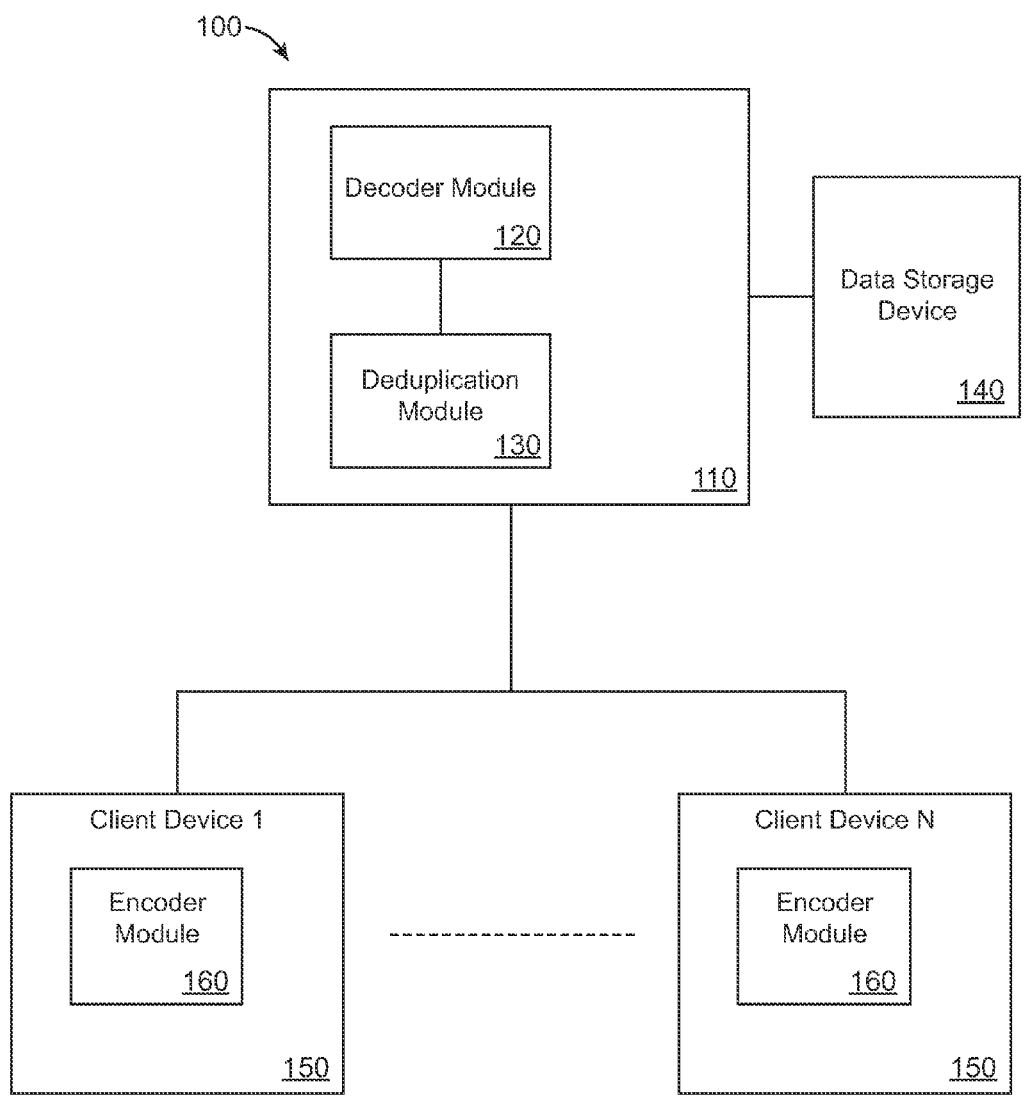
FIG. 1 illustrates a system for reducing redundant data that needs to be transmitted to a server device before data de-duplication according to one embodiment of the invention.

FIG. 1 illustrates a block diagram of a system 100 for reducing transmission of redundant data blocks before de-duplication according to one embodiment. As illustrated, system 100 includes client devices 1 to N 150 including an encoder module 160. In one embodiment of the invention, the encoder uses Slepian-Wolf encoding (David Slepian and J. K. Wolf; "Noiseless Coding of Correlated Information Sources"; IEEE Transactions on Information Theory; July 1973; pp. 471-480; vol. 19.). It should be noted that Slepian-Wolf refers to the compression of the outputs of two or more physically separated sources that do not communicate with each other (hence distributed coding). These sources send their compressed outputs to a central point (e.g., the server device 110) for joint decoding. Other embodiments of the invention use other known distributed coding techniques for encoding and decoding.

The client devices 150 are connected to a server device 110 through a network, wireless connection, wired connection, etc. The server device includes a decoder module 120 and a de-duplication module 130. Coupled to the server device is a data storage device 140. In one embodiment of the invention, the decoder module performs decoding using Slepian-Wolf decoding. In one embodiment of the invention, the client devices 150 include data sources, such as uploaded/downloaded files (e.g., data files, video/audio files, streaming media, etc.) that can be resident or non-resident in client device 150. In one embodiment of the invention, the data source is downloaded from a network (wired or wirelessly), such as the Internet, a local area network (LAN), wide area network (WAN), a disk, a disk drive, flash card, memory, etc.

In one embodiment of the invention, the encoder module 160 uses a length-n Slepian-Wolf coder to encode a binary data block X having a length n into a bitstream Z of m bits, where $m \leq n$ (m and n being integers greater than 0). The client device 150 transmits or routes Z to the server device 110. The server device 110 uses the decoder module 120 of the same Slepian-Wolf code used by the encoder module 160 of the client device 150 to decode X from Z and a set of N stored data blocks on the data storage device 140, each having data block in the set having a length of n $\{Y(i)\}\_\{i=1\}^{\{N\}}$. If the decoding of (Z, Y_i) for i=N is successful, then X is forwarded to the de-duplication module 130 for de-duplication. If the decoding fails and i=N, the server device 110 sends a request to the client device 150 for more information about X. When the client device 150 receives the server device 110 request for more information about X, the encoder module 160 uses the same or a different Slepian-Wolf code to generate another bitstream Z' of m' bits, where $m+m' \leq n$, and transmits or routes Z' to the server device 110 for further decoding by the decoder module 120 where Z=(Z, Z') for the decoding. In one embodiment of the invention, m and the Slepian-Wolf codes are designed to meet a desired collision rate.

Figure 2:
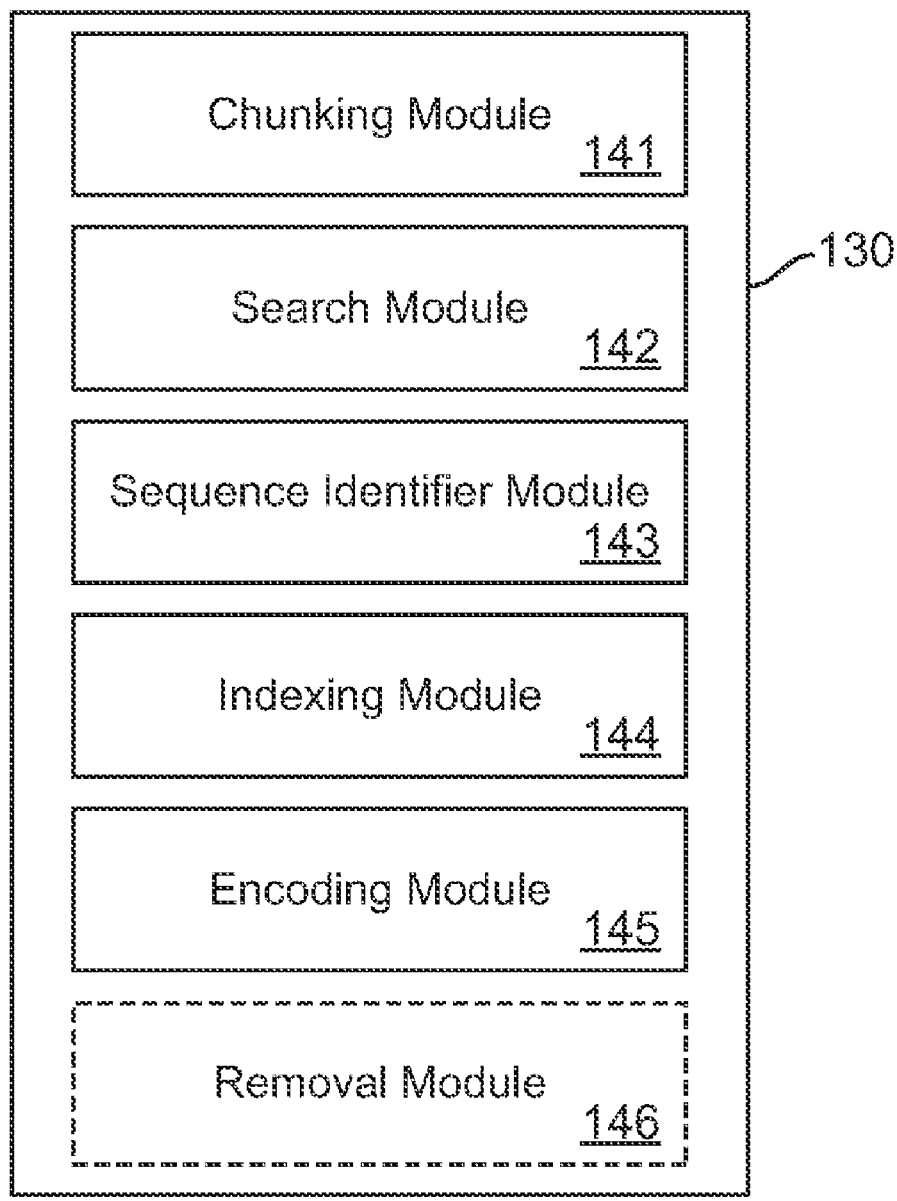
FIG. 2 illustrates a block diagram of a process for reducing redundant data that needs to be transmitted to a server before data de-duplication according to one embodiment of the invention.

FIG. 2 illustrates the de-duplication module 130. The de-duplication module 130 performs de-duplication of the decoded data blocks in the data storage device 140. In one embodiment, metadata includes descriptions, parameters, priority, date, time, and other pertinent information regarding chunked object portions. A hash is a transformation of a string of characters (e.g., metadata) into a shorter fixed-length value or key that represents the original string. In one embodiment, hashing is used to index and retrieve chunk portions in the data storage device 140. It should be noted that it is faster to find a chunk portion using the shorter hashed metadata than to find it using the original value. In one embodiment a hashing function is used to create an indexed version of the represented value of chunk portions of data objects. That is, a hash function is used to index the original value and then used later each time the data associated with the value is to be retrieved. In one embodiment, known hash functions are used, such as a division-remainder method, folding, radix transformation, digit rearrangement, etc. In another embodiment, encryption hash functions are used, such as MD2, MD4, MD5, the Secure Hash Algorithm (SHA), etc.

In one embodiment of the invention, the de-duplication module 130 includes chunking module 141, search module 142, sequence identifier module 143, indexing module 144, encoding module 145 and a removal module 146. In another embodiment of the invention, the individual modules included in the de-duplication module 130 can be a software process, a hardware module or a combination of software and hardware. In one embodiment of the invention, de-duplication module 130 reduces an index of identifiers for chunk portions in de-duplication where the identifiers are metadata hashes of objects. The chunking module 141 is configured to create smaller chunk portions from chunks received from a data chunker. In another embodiment of the invention, the chunking module 141 performs chunking of an input stream of larger chunks by one or more of: fixed size chunking, sliding window chunking, variable size chunking and content dependent chunking, in order to reduce the input stream of chunk portions to smaller chunk portions.

In one embodiment of the invention, the search module 142 searches the data storage device 140 to find matching chunks to a chunk originally destined for the data storage device 140. In one embodiment of the invention, the sequence identifier module 143 operates to identify sequences of chunk portion identifiers of a data object. The indexing module 144 operates to apply indexing to identification of chunk portions based on a chunk repeating sequence type according to one embodiment of the invention. In another embodiment of the invention, the stored identification (e.g., hashed metadata) of chunk portions includes a chronological pointer linking newly added identification of chunk portions in chronological order.

In one embodiment of the invention, the encoding module 145 is connected to the indexing module 144 and the encoding module 145 operates to encode first repeated chunk sequences with a first encoding and encodes second repeated chunk sequences with a second encoding, and repeated sequences of chunk portion identifiers are removed from a memory to reduce storage use. The second encoding identifies the first appearance of the first repeated sequences of chunk portions, according to one embodiment of the invention. In another embodiment of the invention, the second encoding includes a distance offset from a first appearance of a repeated chunk portion to a second appearance of the repeated chunk portion. In one embodiment of the invention, the sequence type is assigned based on a length of repeated chunk identification. In one embodiment of the invention, an optional removal module 146 removes repeated chunk portions from the data storage device 140 to reduce stored chunk portions stored in the data storage device 140.

In one embodiment of the invention, the reduction in the amount of data to be transmitted or routed from the client device 150 to the server device 110 reduces transmission time and/or lowers bandwidth requirements. Since the encoder module 160 includes Slepian-Wolf coding, which is simple to implement and computationally efficient, the embodiments of the invention can be easily integrated into existing applications and systems.

One advantage of using the embodiments of the invention over non-hash-valued server side de-duplication is the amount of data to be transmitted is significantly reduced than using lossless compression in the case where data de-duplication is effective. For data having a duplicated copy stored at the server, de-duplication can be performed in one pass with Slepian-Wolf decoding whereas with lossless compression, decompression and de-duplication have to been performed sequentially in two passes. Other advantages of using the embodiments of the invention over hash-valued server side data de-duplication are: the embodiments are more flexible and efficient than hash-valued server side data de-duplication in the sense that significant compression can still be achieved when no exact copy of the data is available at the server but its slight variations are present (in this case no exact match of the hash value of the data to be transmitted can be found, and as a result the original data needs to be transmitted)[for the Slepian-Wolf case, if the difference between stored uncompressed data and Slepian-Wolf decoded data is small, a second tier of de-duplication can be performed after decoding to further compress stored data]; in contrast to sending only hash values within a definite range, the embodiments of the invention allow flexible adjustment of transmission rate to meet the desired collision rate.

Figure 3:
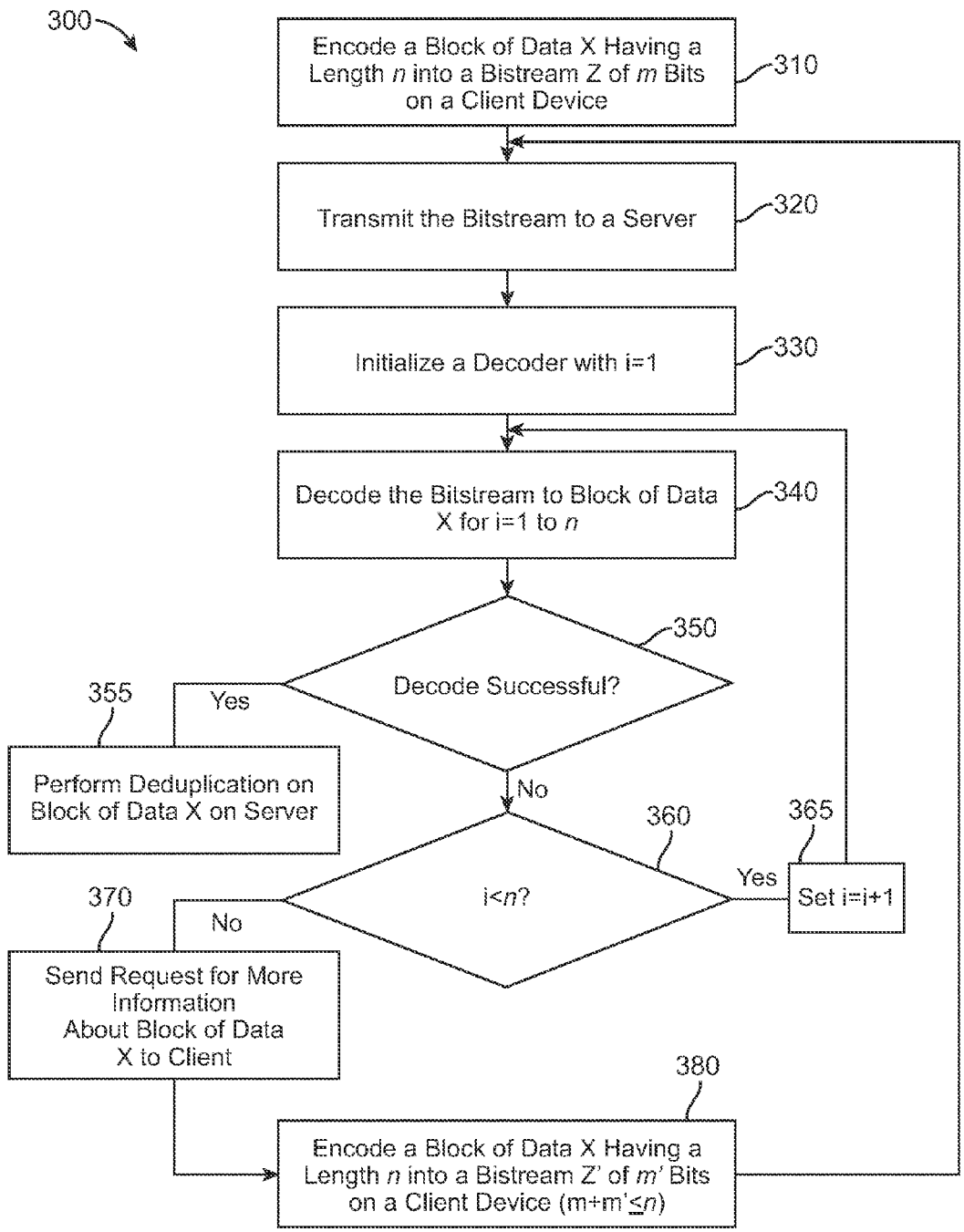
FIG. 3 illustrates a de-duplication module of the system illustrated in FIG. 1 according to one embodiment of the invention.

FIG. 3 illustrates a block diagram of a process 300 for reducing transmission of data from a client device to a server device. Process 300 begins with block 310 where a block of data X having a length n is encoded using a Slepian-Wolf decoder into a bitstream Z of m bits on a client device. In block 320, the bitstream Z is transmitted or routed to a server device. In block 330, a Slepian-Wolf decoder is initialized by setting i to one ("1") where i is an index for decoding the ith block of data in the bitstream Z. In block 340, the bitstream Z is decoded to X for the ith block of data (which is currently is i=1).

Block 350 determines whether the decoding the ith block of data is successful or not. If the decoding for all data block is successful (i.e., i=1−n), process 300 continues to block 355 where data de-duplication is performed on the decoded data block X on the server device. If decoding the ith data block is not successful, process 300 continues with block 360. In block 360, it is determined if i is less than n (i<n). If i is less than n, process 300 continues with block 365 where i is incremented by 1 (i=i+1) and process 300 continues to block 340. If it is determined that i is not less than 1, process 300 continues with block 370 where a request for more information about data block X is sent from the server device to the client device. Process 300 continues with block 380 where the client device encodes a data block of X having a length n using the same or different Slepian-Wolf encoder into a bitstream Z' of m' bits on the client device (where m+m'≦n). Z is then set to (Z,Z') and process 300 continues to block 320. Process 300 continues until data block X is recovered for data de-duplication on the server device.

The embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer, processing device, or any instruction execution system. For the purposes of this description, a computer-usable or computer readable medium can be any apparatus that can contain, store, communicate, or transport the program for use by or in connection with the instruction execution system, apparatus, or device.

The medium can be electronic, magnetic, optical, or a semiconductor system (or apparatus or device). Examples of a computer-readable medium include, but are not limited to, a semiconductor or solid state memory, magnetic tape, a removable computer diskette, a RAM, a read-only memory (ROM), a rigid magnetic disk, an optical disk, etc. Current examples of optical disks include compact disk-read only memory (CD-ROM), compact disk-read/write (CD-R/W) and DVD.

I/O devices (including but not limited to keyboards, displays, pointing devices, etc.) can be connected to the system either directly or through intervening controllers. Network adapters may also be connected to the system to enable the data processing system to become connected to other data processing systems or remote printers or storage devices through intervening private or public networks. Modems, cable modem and Ethernet cards are just a few of the currently available types of network adapters.

In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:
    reducing redundant data blocks by decoding a first data block from a first plurality of data blocks and a bitstream.

2. The method of claim 1, wherein each block in the first plurality of data blocks has a length equal to the first length.

3. The method of claim 1, wherein the decoding is performed with a Slepian-Wolf decoder.

4. The method of claim 1, wherein upon decoding being successful for the complete first length, de-duplication is performed on the first data block.

5. The method of claim 1, wherein upon the decoding being unsuccessful for the complete first length, requesting further information of the first data block from a client.

6. The method of claim 4, further comprising:
    encoding the first data block having the first length into another bitstream having one of the second length and a third length;
    transmitting the other bitstream to the server; and
    reducing redundant data blocks by decoding the first data block from a second plurality of data blocks and the other bitstream, where each block in the second plurality of data blocks has a length equal to the first length.

7. The method of claim 1, wherein de-duplication is performed by the decoding.

8. The method of claim 1, wherein the decoding is performed with a variable length for a predetermined collision rate.

9. The method of claim 1, wherein a transmission rate for the transmitting is variable to meet a predetermined collision rate.

10. A system for reducing redundant data blocks, comprising:
    a client device including an encoder module configured to encode a data block into a bitstream; and
    a server device including a decoder module configured to decode a first data block from a first plurality of data blocks and the bitstream for reducing redundant data blocks.

11. The system of claim 10, further comprising;
    a de-duplication module coupled to the decoder module configured to deduplicate successful decoded portions of the first data block; and
    a data storage device coupled to the server device.

12. The system of claim 10, further comprising at least another client device.

13. The system of claim 10, wherein the encoder module performs a Slepian-Wolf encoding.

14. The system of claim 10, wherein the decoder module performs a Slepian-Wolf decoding.

15. A computer program product comprising a computer usable medium including a computer readable program, wherein the computer readable program when executed on a computer causes the computer to:
    encode a first data block having a first length into a bitstream having a second length; and
    reduce redundant data blocks by decoding the first data block from a first plurality of data blocks and the bitstream.

16. The computer program product of claim 15, wherein the decoding is performed with a Slepian-Wolf decoder.

17. The computer program product of claim 15, wherein upon decoding being successful for the complete first length, de-duplication is performed on the first data block.

18. The computer program product of claim 15, wherein upon decoding being unsuccessful for the complete first length, requesting further information of the first data block from a client.

19. The computer program product of claim 15, further causing the computer to:

transmit the bitstream to a server;
encode the first data block having the first length into another bitstream having one of the second length and a third length;
transmit the other bitstream to the server; and
reduce redundant data blocks by decoding the first data block from a second plurality of data blocks and the other bitstream, where each block in the second plurality of data blocks has a length equal to the first length.

20. The computer program product of claim 15, wherein a transmission rate for the transmitting is variable to meet a predetermined collision rate.

21. A method comprising:
encoding a first data block having a first length into a bitstream having a second length using a Slepian-Wolf encoding process;
reducing redundant data blocks before de-duplication using a Slepian-Wolf decoding process by decoding the first data block from a first plurality of data blocks and the bitstream.

22. The method of claim 21, wherein upon the decoding being unsuccessful for the complete first length, requesting further information of the first data block from a client.

23. The method of claim 22, further comprising:
transmitting the bitstream to a server device;
encoding the first data block having the first length into another bitstream having one of the second length and a third length;
transmitting the other bitstream to the server device; and
reducing redundant data blocks by decoding the first data block from a second plurality of data blocks and the other bitstream, where each block in the second plurality of data blocks has a length equal to the first length.

24. A system for reducing transmission of redundant data blocks, comprising:
a client device including a Slepian-Wolf encoder module configured to encode a data block into a bitstream; and
a server device including a Slepian-Wolf decoder module configured to decode the bitstream using a plurality of previously stored data blocks on the server device.

25. The system of claim 24, further comprising:
a de-duplication module coupled to the decoder module configured to deduplicate successful decoded portions of the data block,
wherein the Slepian-Wolf decoder is configured to reduce redundant data blocks before de-duplication.

* * * * *